(12) United States Patent
Chen et al.

(10) Patent No.: US 7,544,621 B2
(45) Date of Patent: Jun. 9, 2009

(54) METHOD OF REMOVING A METAL SILICIDE LAYER ON A GATE ELECTRODE IN A SEMICONDUCTOR MANUFACTURING PROCESS AND ETCHING METHOD

(75) Inventors: Cheng-Kuen Chen, Taipei (TW); Chih-Ning Wu, Hsin-Chu (TW); Wei-Tsun Shiau, Kao-Hsiung Hsien (TW); Wen-Fu Yu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/163,849

(22) Filed: Nov. 1, 2005

(65) Prior Publication Data
US 2007/0099423 A1 May 3, 2007

(51) Int. Cl.
*H01L 21/302* (2006.01)
(52) U.S. Cl. ............ 438/697; 438/698; 438/704; 438/714; 438/721; 438/724; 438/755; 438/757
(58) Field of Classification Search .......... 438/697, 438/698, 704, 714, 721, 724, 755, 757; 134/1.2, 134/1.3
See application file for complete search history.

(56) References Cited

U.S. PATENT DOCUMENTS

| 4,569,722 | A | * | 2/1986 | Maury et al. | 216/99 |
| 5,162,259 | A | * | 11/1992 | Kolar et al. | 438/642 |
| 5,259,923 | A | * | 11/1993 | Hori et al. | 216/66 |
| 5,994,234 | A |   | 11/1999 | Ouchi |  |
| 6,037,265 | A | * | 3/2000 | Mui et al. | 438/719 |
| 6,146,542 | A |   | 11/2000 | Ha et al. |  |
| 6,455,428 | B1 | * | 9/2002 | Tseng | 438/689 |
| 6,548,344 | B1 | * | 4/2003 | Beintner et al. | 438/241 |
| 6,881,670 | B2 |   | 4/2005 | Chen |  |
| 2002/0025673 | A1 |   | 2/2002 | Song et al. |  |
| 2004/0115952 | A1 | * | 6/2004 | Kim et al. | 438/754 |
| 2005/0054193 | A1 | * | 3/2005 | Chen et al. | 438/634 |

FOREIGN PATENT DOCUMENTS

| CN | 1185029 A | 6/1998 |
| JP | P2004-273556 A | 9/2004 |
| TW | 466686 | 12/2001 |
| TW | 569347 | 1/2004 |
| TW | I229917 | 3/2005 |
| TW | I242811 | 11/2005 |

* cited by examiner

*Primary Examiner*—George A. Goudreau
(74) *Attorney, Agent, or Firm*—Winston Hsu

(57) ABSTRACT

A method of removing a metal silicide layer on a gate electrode in a semiconductor manufacturing process is disclosed, in which the gate electrode, a metal silicide layer, a spacer, a silicon nitride cap layer, and a dielectric layer have been formed. The method includes performing a chemical mechanical polishing process to polish the dielectric layer using the silicon nitride cap layer as a polishing stop layer to expose the silicon nitride cap layer over the gate electrode; removing the exposed silicon nitride cap layer to expose the metal silicide layer; and performing a first etching process to remove the metal silicide layer on the gate electrode.

14 Claims, 19 Drawing Sheets

METHOD OF REMOVING A METAL SILICIDE LAYER ON A GATE ELECTRODE IN A SEMICONDUCTOR MANUFACTURING PROCESS AND ETCHING METHOD

BACKGROUND OF THE INVENTION

1. Field of the Invention

The present invention relate to a semiconductor device manufacturing process, and particularly to removal of a salicide layer in a semiconductor device manufacturing process.

2. Description of the Prior Art

Semiconductor device geometries have dramatically decreased in size since such devices were first introduced several decades ago. Today's fabrication plants are producing devices having 0.35 µm, 90 nm, and even 65 nm feature sizes or smaller. As geometries shrink, semiconductor manufacturing methods often need to be improved.

As MOS devices have been integrated at a rapid speed, an existing process using polysilicon as a gate electrode has caused many problems such as high gate resistance, depletion of polysilicon, and boron penetration into a channel area. A known process including a metal gate electrode/high-k gate dielectric layer has been proposed to eliminate the poly depletion effect and to offer an option of a lower thermal budget process.

FIGS. 1 to 5 are cross-sectional views illustrating a MOS transistor 10 having a metal gate electrode fabricated according to a known process. Referring to FIG. 1, a polysilicon gate electrode 12 is formed on a semiconductor substrate comprising a silicon layer 16, and a shallow-junction source extension 17 and a shallow-junction drain extension 19 are formed in the silicon layer 16 at both sides of the polysilicon gate electrode 12 and separated by a channel region 22. Then, a spacer 32 is formed on both lateral walls of the polysilicon gate electrode 12, and source and drain regions 18 and 20 are formed in the silicon layer 16 at both sides of the polysilicon gate electrode 12 and border the shallow-junction source extension 17 and the shallow-junction drain extension 19. A gate dielectric layer 14 separates a gate electrode 12 from the channel region 22. A liner 30, generally comprising silicon dioxide, is interposed between the gate electrode 12 and the silicon nitride spacer 32. Subsequently, a metal silicide layer 42 is formed on the top of the polysilicon gate electrode 12 and the surface of the source and drain regions 18 and 20, and a silicon nitride cap layer 46 is formed on the entire area of the semiconductor substrate having the source and drain regions 18 and 20 and the shallow-junction source extension 17 and the shallow-unction drain extension 19, so that the polysilicon gate electrode 12 can be covered. Next, a dielectric layer 48 is formed on the nitride layer 46. The silicon nitride cap layer 46 is usually between about 300 and about 1000 Å (angstrom) in thickness, and is formed by a plasma enhanced chemical vapor deposition (PECVD) process.

Next, referring to FIG. 2, the metal silicide layer 42 and the dielectric layer 48 are polished by a CMP process until the top of the polysilicon gate electrode 12 is exposed. The CMP process is performed by over polishing so that the top of the polysilicon gate electrode 12 can be exposed completely.

Subsequently, referring to FIG. 3, the remaining polysilicon gate electrode 12 is removed by a plasma reactive ion etch (RIE) using chlorine or a wet polysilicon etch using conventional etch chemistry to form an opening (i.e. recess) 54. Referring to FIG. 4, a barrier metal layer 56 may be formed on the sidewall of the recess 54 and on the surface of the dielectric layer 48, the nitride layer 46, the spacers 32, and the liner 30, and then a metal layer 58 is deposited to fill the recess and on the barrier metal layer 56. Finally, referring to FIG. 5, the surplus portion of metal layer 58 is polished away, forming a MOS transistor 10 having a metal gate.

The fabrication method described above includes an integration flow of metal gate replacement process consisting of an ILD (inter-layer dielectric) CMP (chemical mechanical polishing) after a transistor being built, a removal of a metal silicide layer and a polysilicon plug, a metal layer deposition, and a metal CMP. However, it is very difficult to remove the metal silicide by a CMP process.

FUSI gates (fully silicided polysilicon gates) offer a potential metal gate alternative due to a relative simplicity of the integration process. Referring to FIG. 2, the metal silicide layer 42 on the top of the gate electrode 12 and the dielectric layer 48 are polished by a CMP process until the top of the polysilicon gate electrode 12 is exposed. Then, referring to FIG. 6, a metal layer 50 is deposited on the exposed region of the polysilicon gate electrode 12, the nitride layer 46, the spacers 32, the liner 30, and the dielectric layer 48. The metal layer 50 is usually less than about 1000 Å and, in some cases, may be between about 500 and about 1000 Å in thickness. The metal layer 50 may be a multilayer of Ti/TiN, Co/TiN, or Co/Ti/TiN.

A thermal treatment is performed on the substrate having the metal layer 50 to transform the polysilicon gate electrode into a metal silicide gate electrode 52. The thermal treatment process may be performed through two steps, i.e., a first step at a temperature of about 400° C. to about 600° C., and a second step using a rapid thermal process (RTP) at a temperature of about 800° C. to about 1000° C. Subsequently, the residual metal layer, which has not reacted, is removed. The resultant MOS transistor 15 having a fully silicided gate electrode is shown in FIG. 7.

In the fabrication method including a FUSI metal gate integration process described above, NiSi polycide is removed through a direct ILD CMP step and the full silicidaton of polysilicon is followed to form a NiSi metal gate. However, the difficulty to remove the metal silicide by a CMP process also exists in this method. It is very hard to control and polish the NiSi polycide layer with good removal uniformity directly using a CMP process.

Therefore, there is still a need for a better method to remove a salicide layer in a semiconductor device manufacturing process.

SUMMARY OF THE INVENTION

An object of the present invention is to provide a method of removing a metal silicide layer on a gate electrode in a semiconductor manufacturing process, to effectively and uniformly remove metal silicide layers on a gate electrode, such that the subsequently process can be performed advantageously.

In an aspect of one embodiment according to the present invention, a wet etching method is also provided to effectively and uniformly remove metal silicide layers.

In an aspect of another embodiment according to the present invention, a dry etching method is also provided to effectively and uniformly remove metal silicide layers.

In the method of removing a metal silicide layer on a gate electrode in a semiconductor manufacturing process according to the present invention, the gate electrode is disposed on a semiconductor substrate, the gate electrode has a top surface coated with a metal silicide layer, a spacer is disposed on each side wall formed by the gate electrode and the metal silicide layer together, a silicon nitride cap layer covers the metal silicide layer, the spacers, and the semiconductor substrate, and a dielectric layer covers the silicon nitride cap layer. The method of removing a metal silicide layer on a gate electrode in a semiconductor manufacturing process comprises steps of performing a chemical mechanical polishing process to polish the dielectric layer using the silicon nitride cap layer as a polishing stop layer to expose the silicon nitride cap layer over the gate electrode; removing the exposed silicon nitride cap layer to expose the metal silicide layer; and performing a first etching process to remove the metal silicide layer on the gate electrode.

The wet etching method according to the present invention comprises a step of performing a wet etching process on a metal silicide layer using an etching solution. The etching solution comprises HF, $NH_4F$, at least one selected from a group consisting of ethylene glycol and propylene glycol, and water.

The dry etching method according to the present invention comprises a step of performing a dry etching process on a metal silicide layer using an etching recipe. The etching recipe comprises argon, at least one selected from a group consisting of hydrogen gas and chlorine gas, and carbon monoxide.

The removal of metal silicide layers in the prior art is performed by means of a CMP process, and it is not easy to obtain a good polishing result. Contrarily, the method of the present invention has good etching selectivity, and thus an effective and a uniform removal of metal silicide layers on gate electrodes can be obtained to benefit the subsequent manufacturing process, therefore a semiconductor device with better quality can be obtained.

These and other objectives of the present invention will no doubt become obvious to those of ordinary skill in the art after reading the following detailed description of the preferred embodiment that is illustrated in the various figures and drawings.

DETAILED DESCRIPTION

The present invention pertains to a method of fabricating MOS transistor devices, such as NMOS, PMOS, and CMOS devices of integrated circuits, and especially to a removal method of a metal silicide layer on a gate electrode.

Please refer to FIGS. 8 to 17. FIGS. 8 to 17 are schematic cross-sectional diagrams illustrating a method of fabricating a semiconductor MOS transistor device 40 in accordance with one preferred embodiment of the present invention, wherein like number numerals designate similar or the same parts, regions or elements. It is to be understood that the drawings are not drawn to scale and are served only for illustration purposes.

Figure 1:
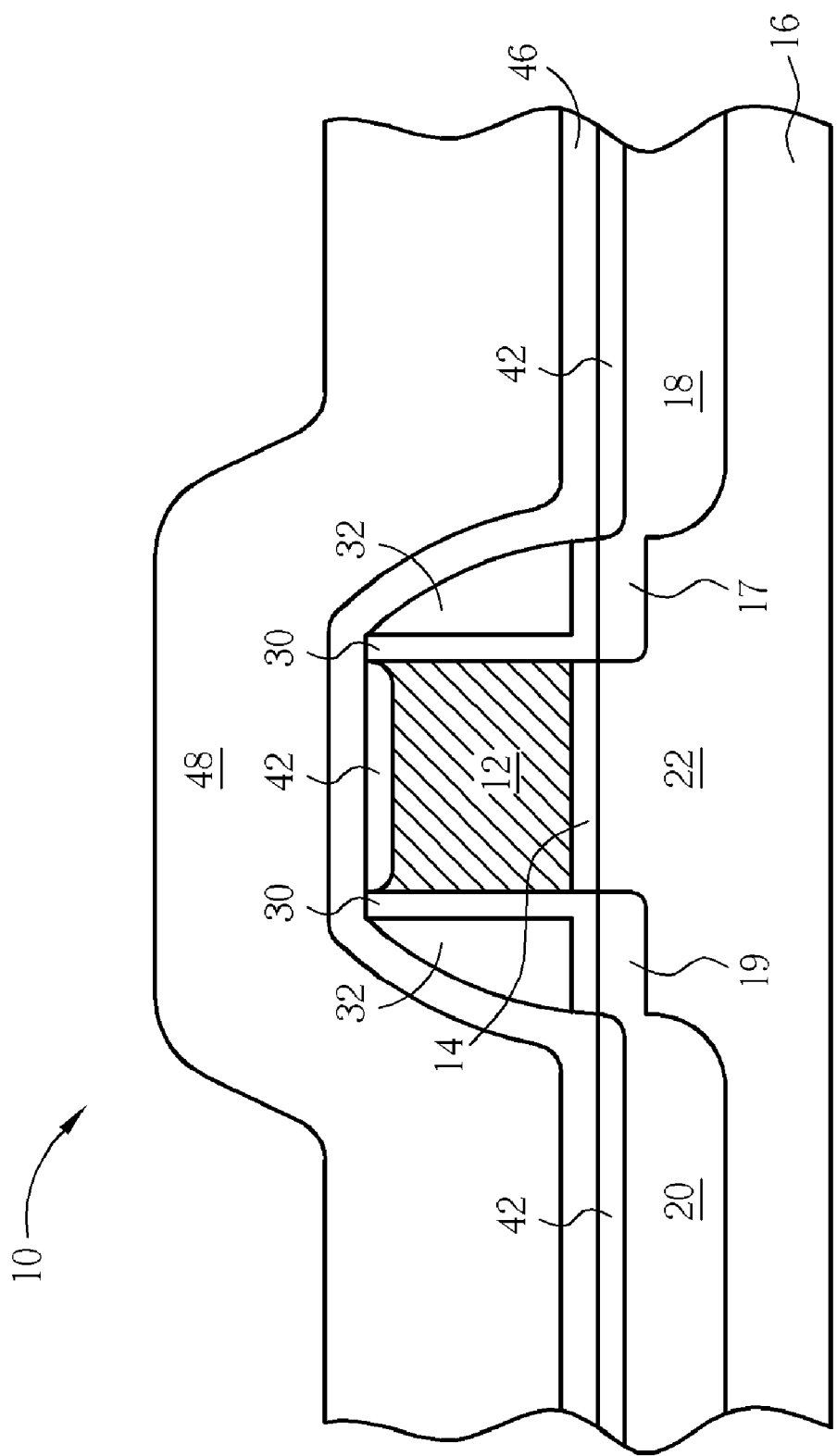
FIGS. 1 to 5 are cross-sectional views illustrating a MOS transistor having a metal gate electrode fabricated according to a known process.
Figure 2:
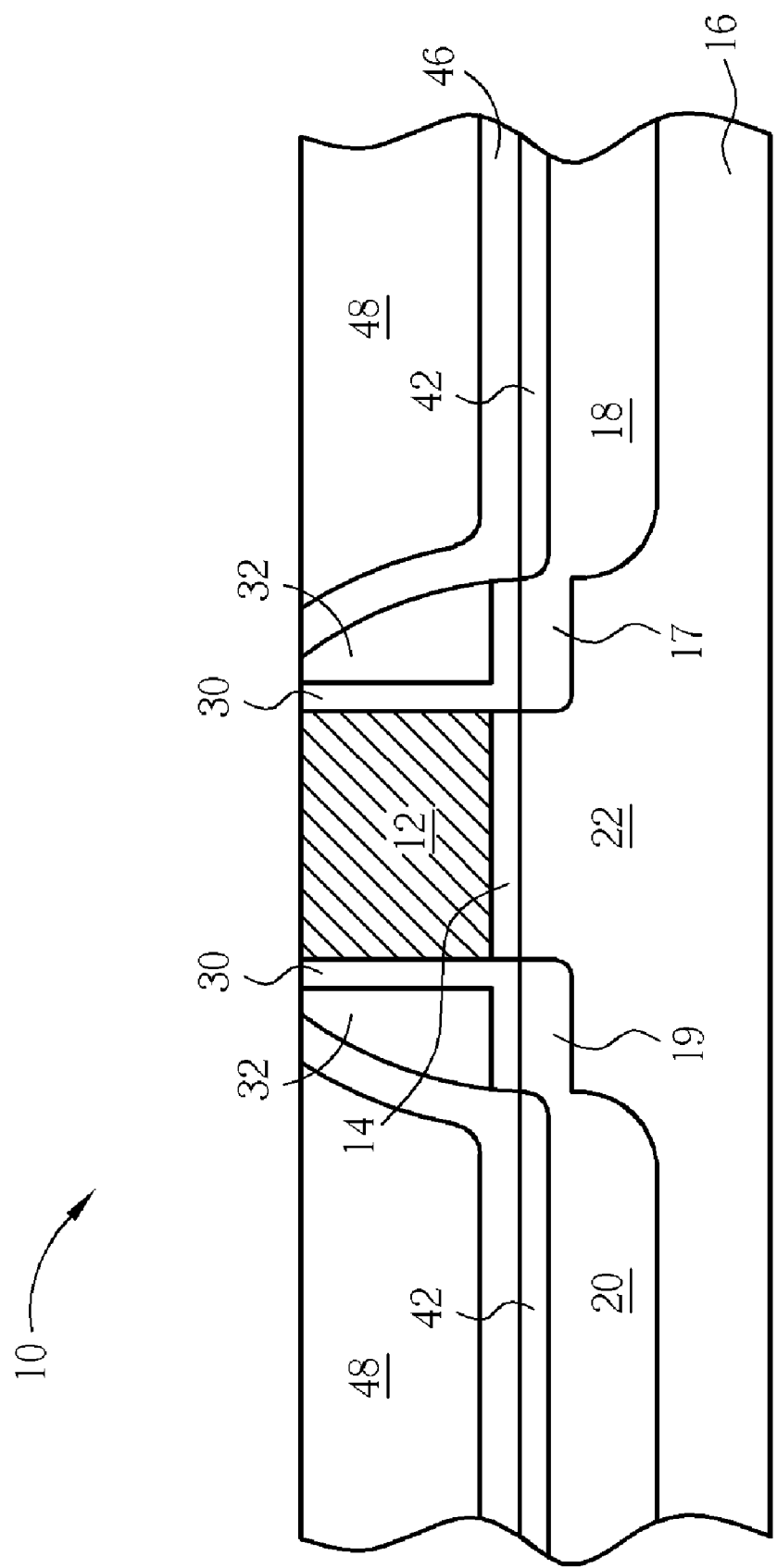
Figure 3:
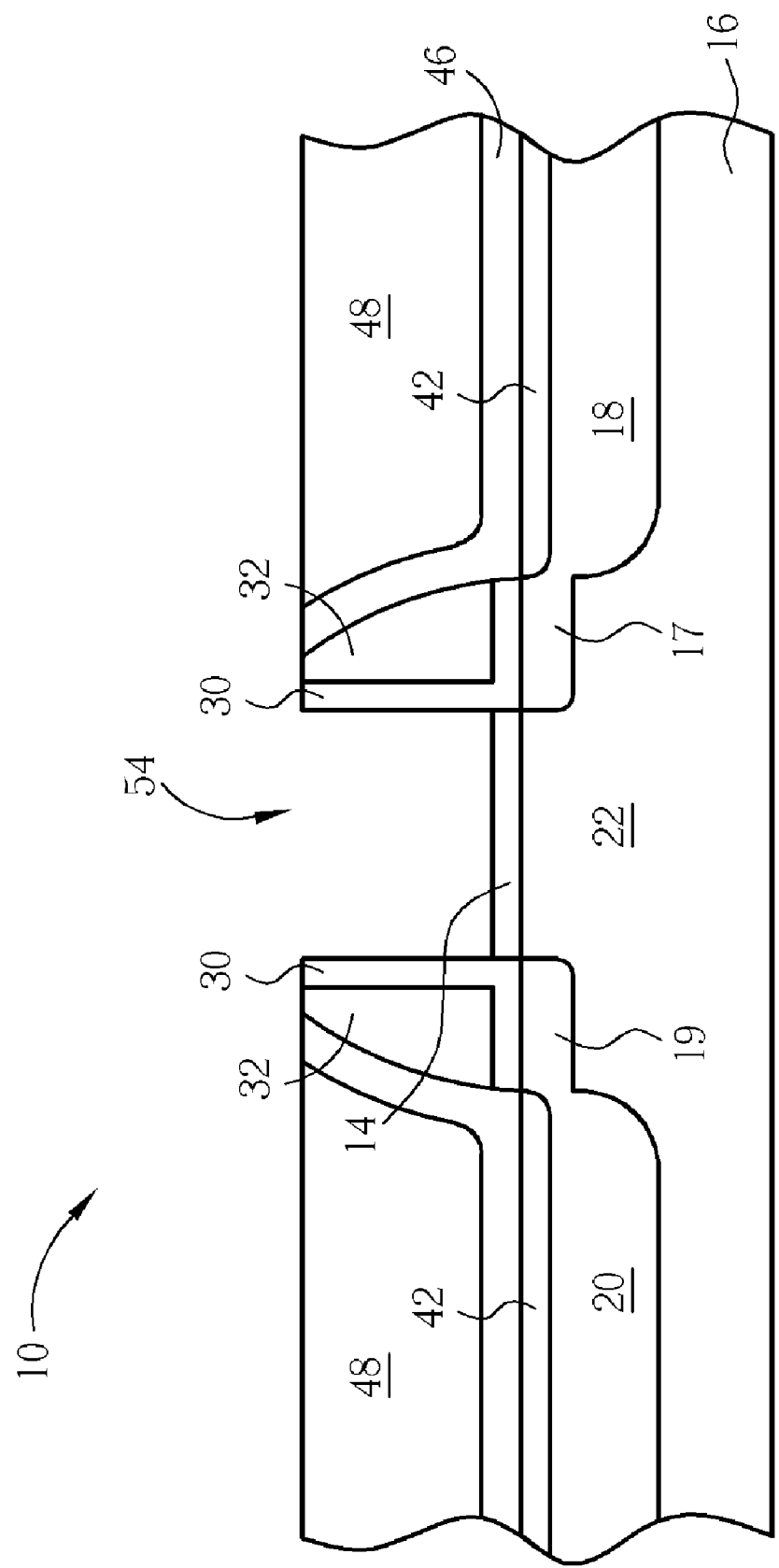
Figure 4:
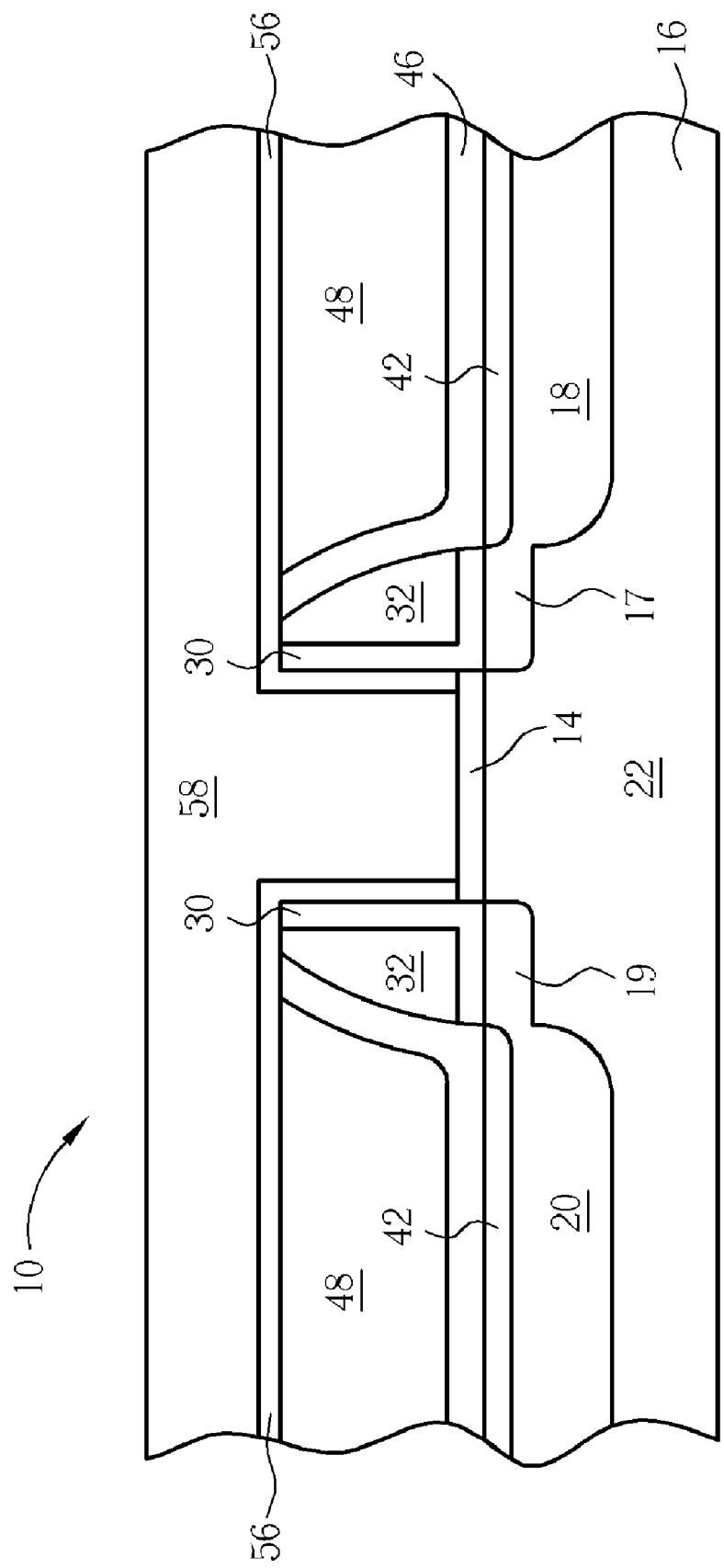
Figure 5:
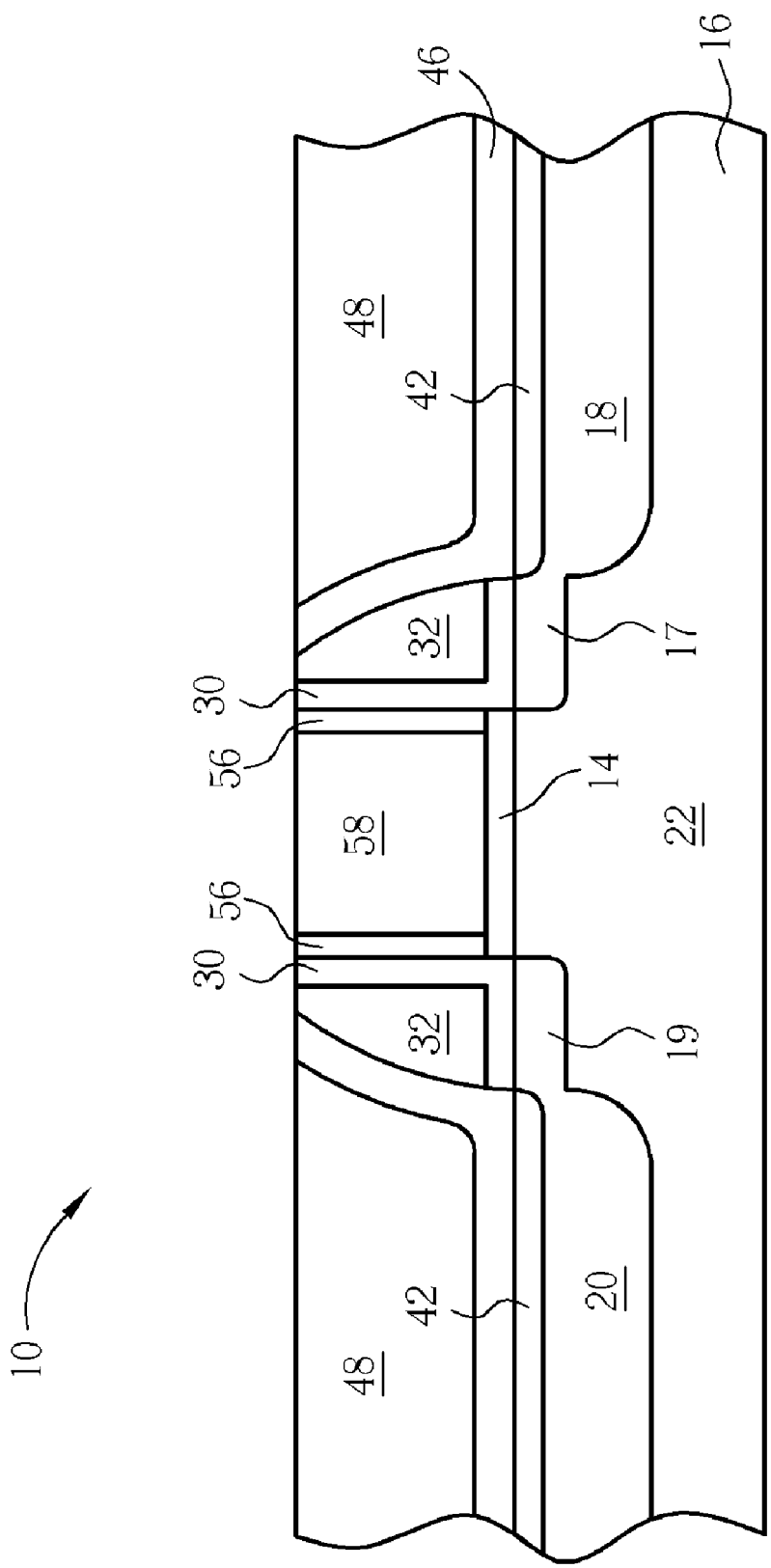
Figure 6:
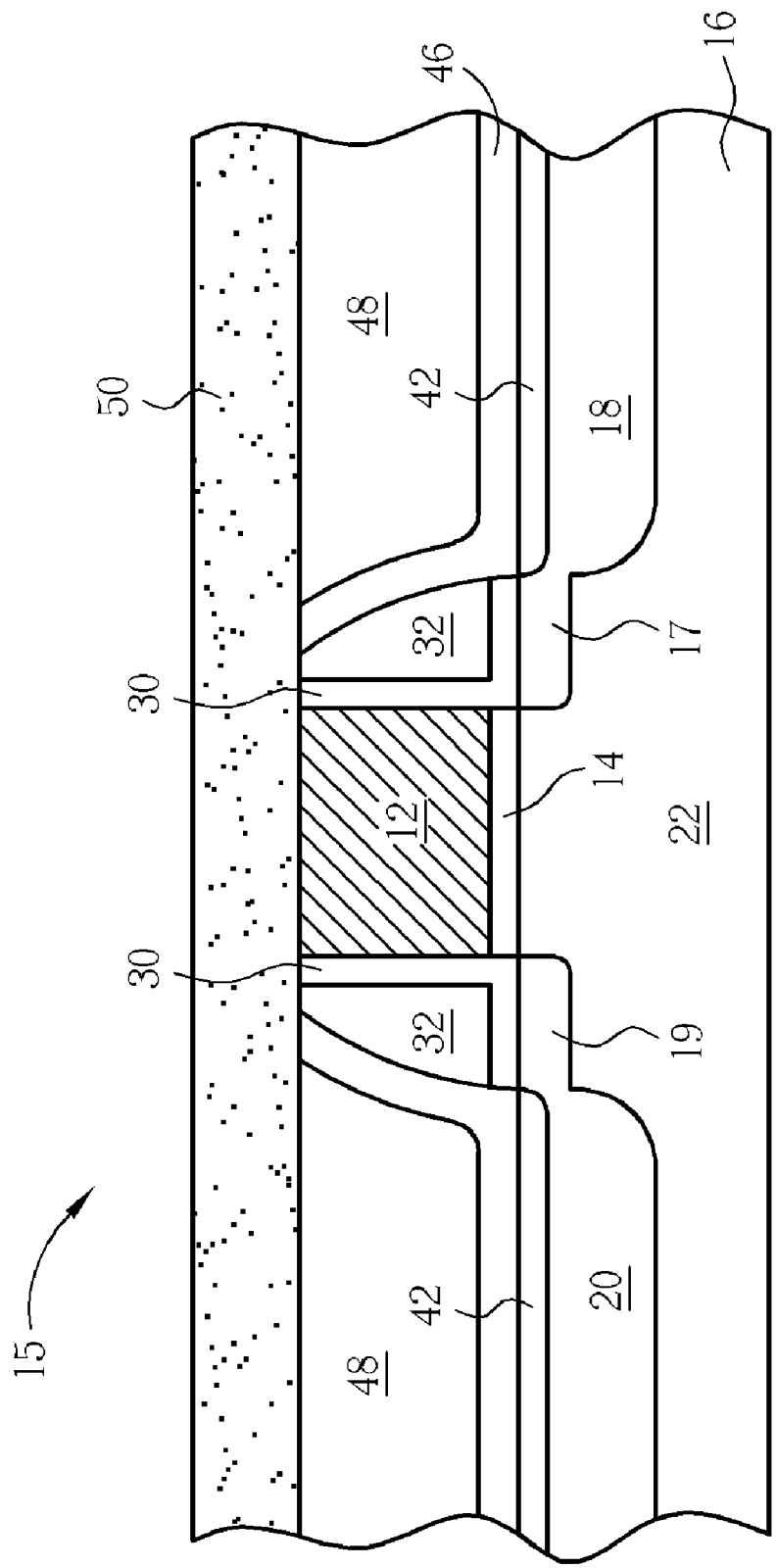
FIGS. 6 to 7 are cross-sectional views illustrating a MOS transistor having a FUSI gate electrode fabricated according to a known process.
Figure 7:
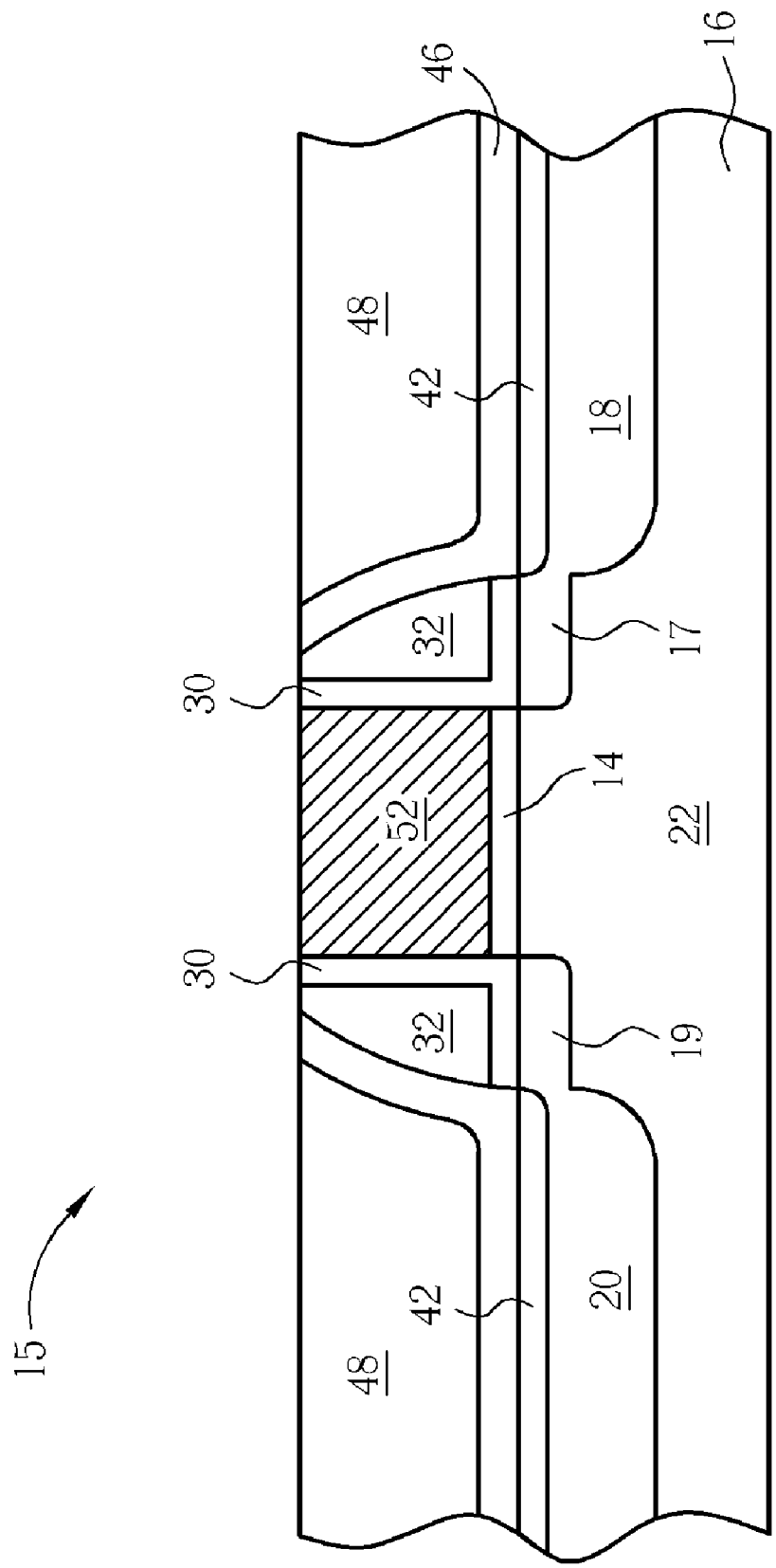
Figure 8:
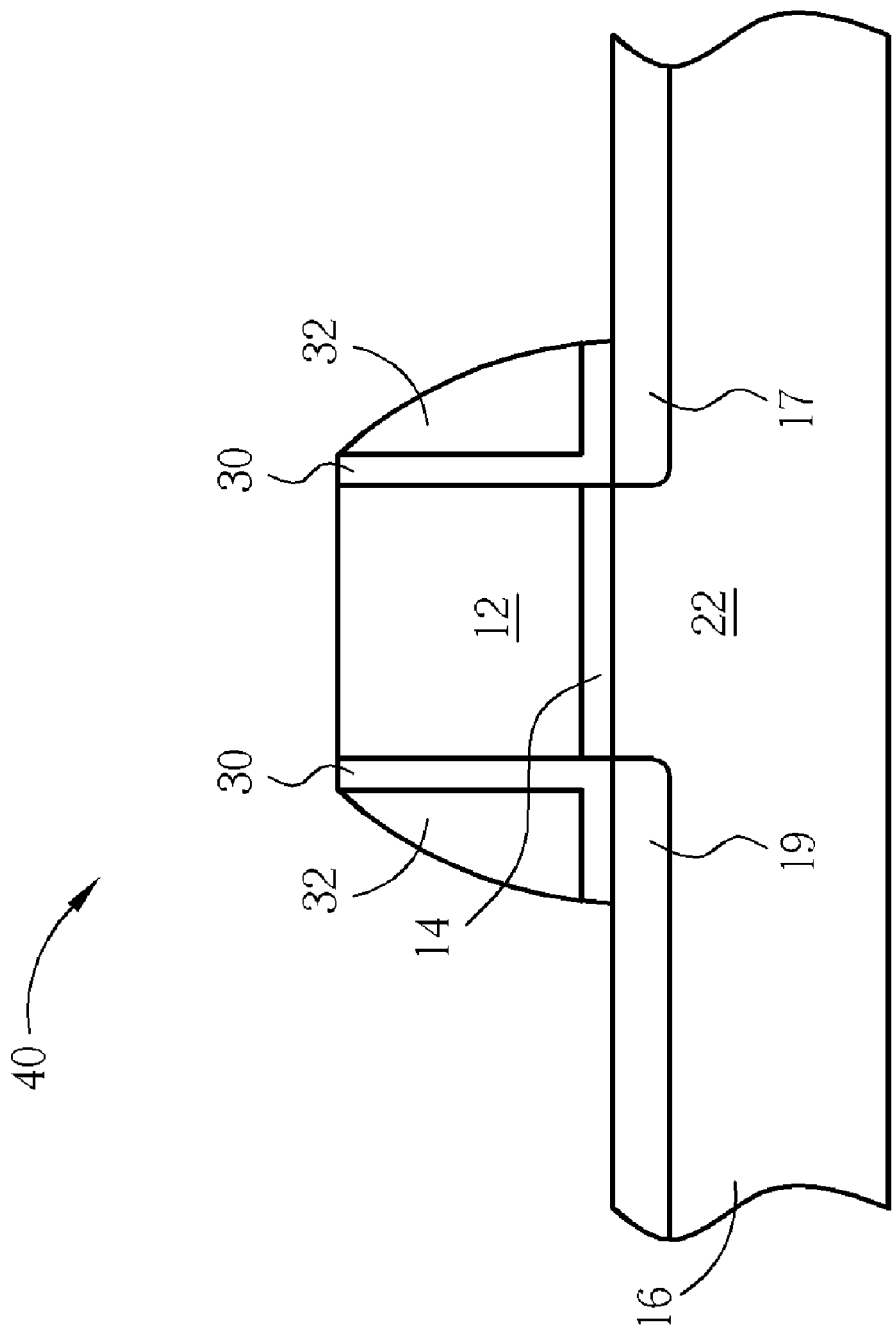
FIGS. 8 to 17 are schematic cross-sectional diagrams illustrating a method of fabricating a semiconductor MOS transistor device having a metal gate in accordance with one preferred embodiment of the present invention.

As shown in FIG. 8, a semiconductor substrate generally comprising a silicon layer 16 is prepared. According to this invention, the semiconductor substrate may be a silicon substrate or a silicon-on-insulator (SOI) substrate, but is not limited thereto. An electrode, such as a gate electrode 12, is defined on the semiconductor substrate. A shallow-junction source extension 17 and a shallow-junction drain extension 19 may be formed in the silicon layer 16. The source extension 17 and the drain extension 19 are separated by a channel 22.

A gate dielectric layer 14 may be formed to separate the gate electrode 12 from the channel 22. The gate electrode 12 generally comprises polysilicon. The gate dielectric layer 14 may be a silicon dioxide film formed with thermal oxidation, or a silicon oxide/silicon nitride (ON) composite film formed with thermal oxidation and subsequent thermal nitridation. However, in another case, the gate dielectric layer 14 may be made of high-k materials known in the art, with a thickness between about 50 Å and about 200 Å, for example, formed by conventional methods of deposition, such as chemical vapor deposition. Typical materials that may be used in the high k gate dielectric layer 14 include $ZrO_2$, $HfO_2$, $InO_2$, $LaO_2$, and $TaO_2$, for example. Subsequently, a silicon nitride spacer 32 is formed on sidewalls of the gate electrode 12. A liner 30, such as silicon dioxide, may be interposed between the silicon nitride spacer 32 and the gate electrode 12. The liners 30 are typically L shaped and have a thickness of about 30 to 120 Å. The liner 30 may further comprise an offset spacer that is known in the art and is thus omitted in the drawings.

Figure 9:
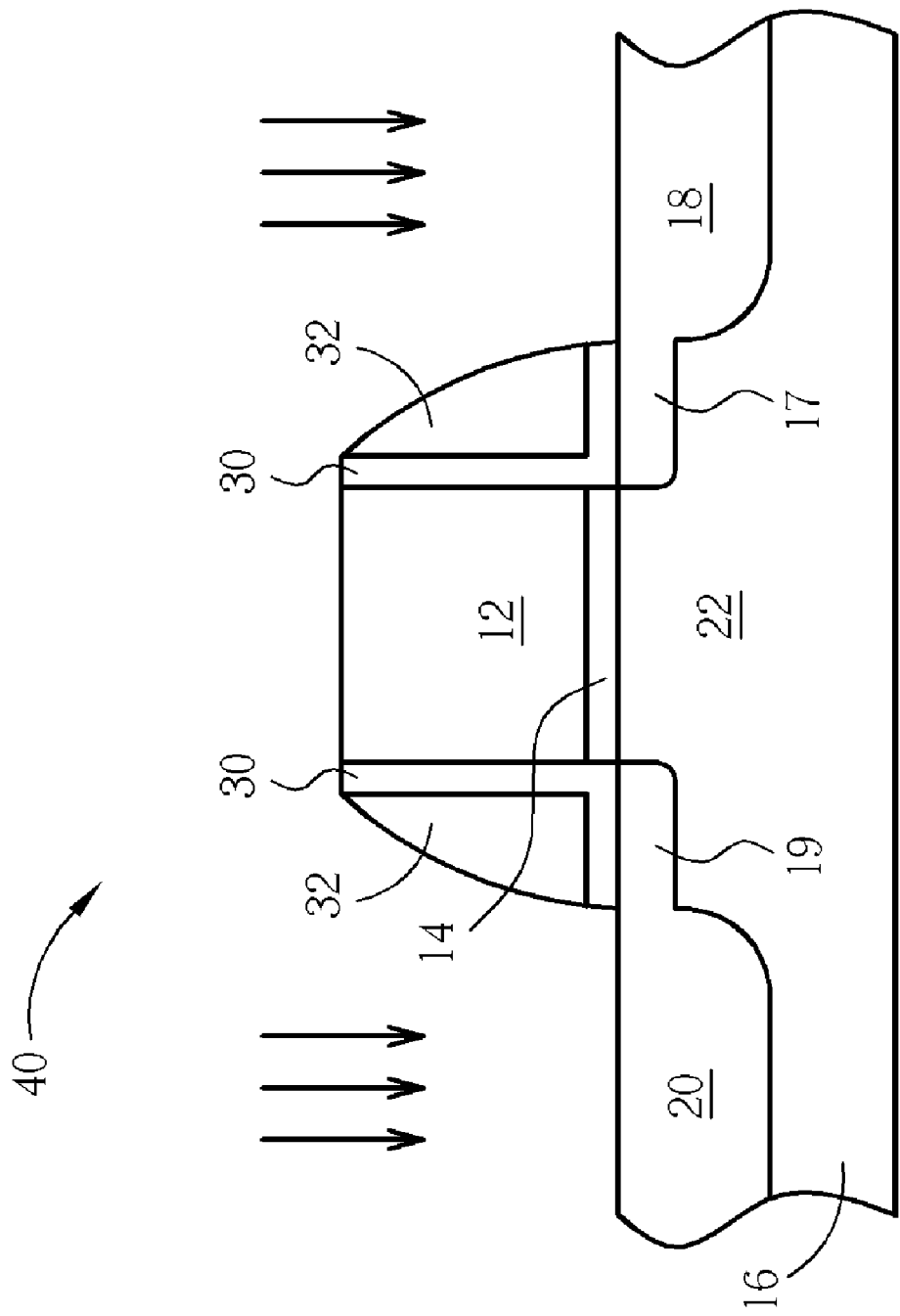

As shown in FIG. 9, after forming the silicon nitride spacer 32, a source region 18 and a drain region 20 may be further formed in the semiconductor substrate by an ion implantation process carried out by doping dopant species, such as N type dopant species (such as arsenic, antimony or phosphorous) for making an NMOS or P type dopant species (such as boron) for making a PMOS, into the silicon layer 16. After the source/drain doping, the substrate may be subjected to an annealing and/or activation thermal process that is known in the art.

Figure 10:
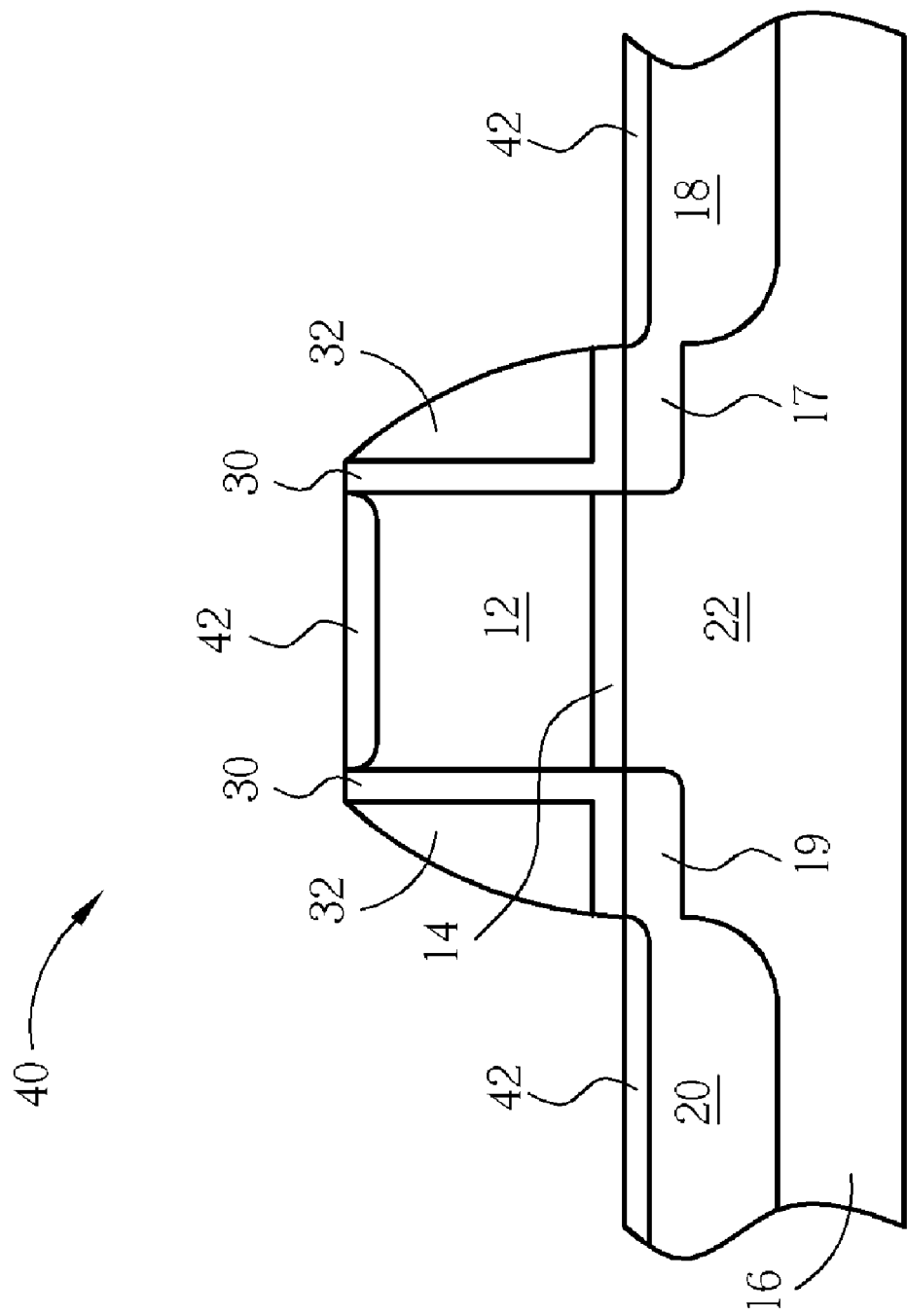

As shown in FIG. 10, a layer, such as a metal silicide layer 42, is formed on the gate electrode 12, on the exposed source region 18 and on the exposed drain region 20. The metal silicide layer 42 may be formed using the process known as self-aligned silicide (salicide) process, in which, after a source/drain region is formed, a metal layer is disposed on the source/drain region and the gate structure by a sputtering or plating, and a rapid thermal process (RTP) is performed to react the metal layer with the silicon contained within the gate structure and the source/drain region to form a metal silicide. The metal silicide may be, for example, nickel silicon compound or nickel cobalt compound, such as, nickel silicide (NiSi) or cobalt silicide ($CoSi_2$). The temperature for RTP may be in the range of 700° C. to 1000° C. After the salicide layer is formed, the spacer 32 may be removed or retained as desired.

Figure 11:
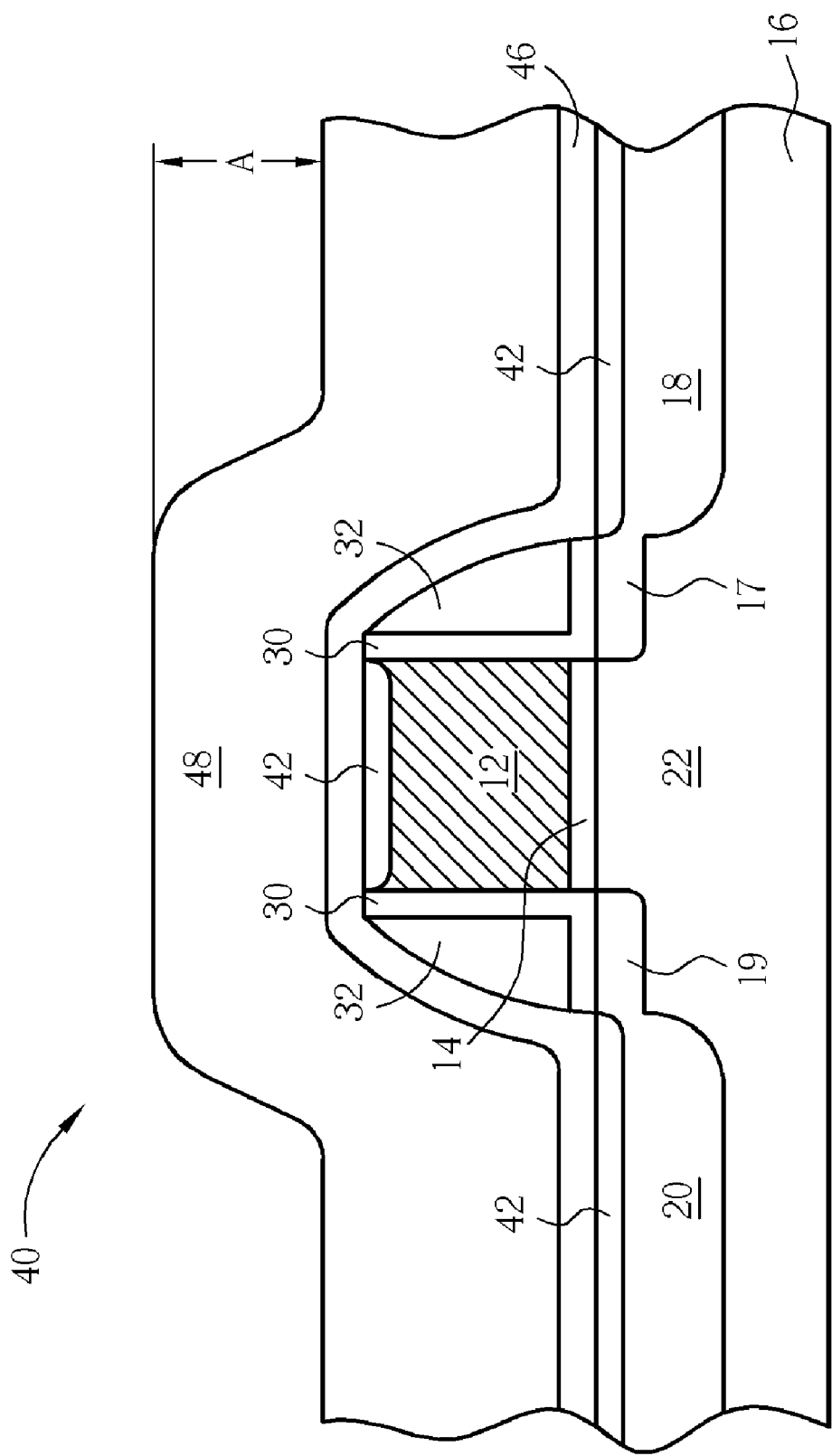

Subsequently, as shown in FIG. 11, a conformal silicon nitride cap layer 46 is further deposited on the substrate. The silicon nitride cap layer 46 covers the metal silicide layer 42 and the SiN spacer 32 and has a thickness of about 200 to 400 Å. The silicon nitride cap layer 46 may function as a stop layer for an etching subsequently performed for making a contact hole. The silicon nitride cap layer 46 may be deposited in a compressive-stressed status to give the underlying source/drain region a strained structure for enhancement of electron or electric hole mobility of the channel region 22. A dielectric layer 48 is deposited after the silicon nitride cap layer 46 is deposited. The dielectric layer 48 may comprise silicon oxide, multilayered metal oxide or perovskite. The dielectric layer 48 is typically much thicker than the silicon nitride cap layer 46. The portion with a thickness A from top of dielectric layer 48 to the silicon nitride cap layer 46 over the gate electrode 12 is the portion to be removed using a CMP process in the method according to the present invention.

Figure 12:
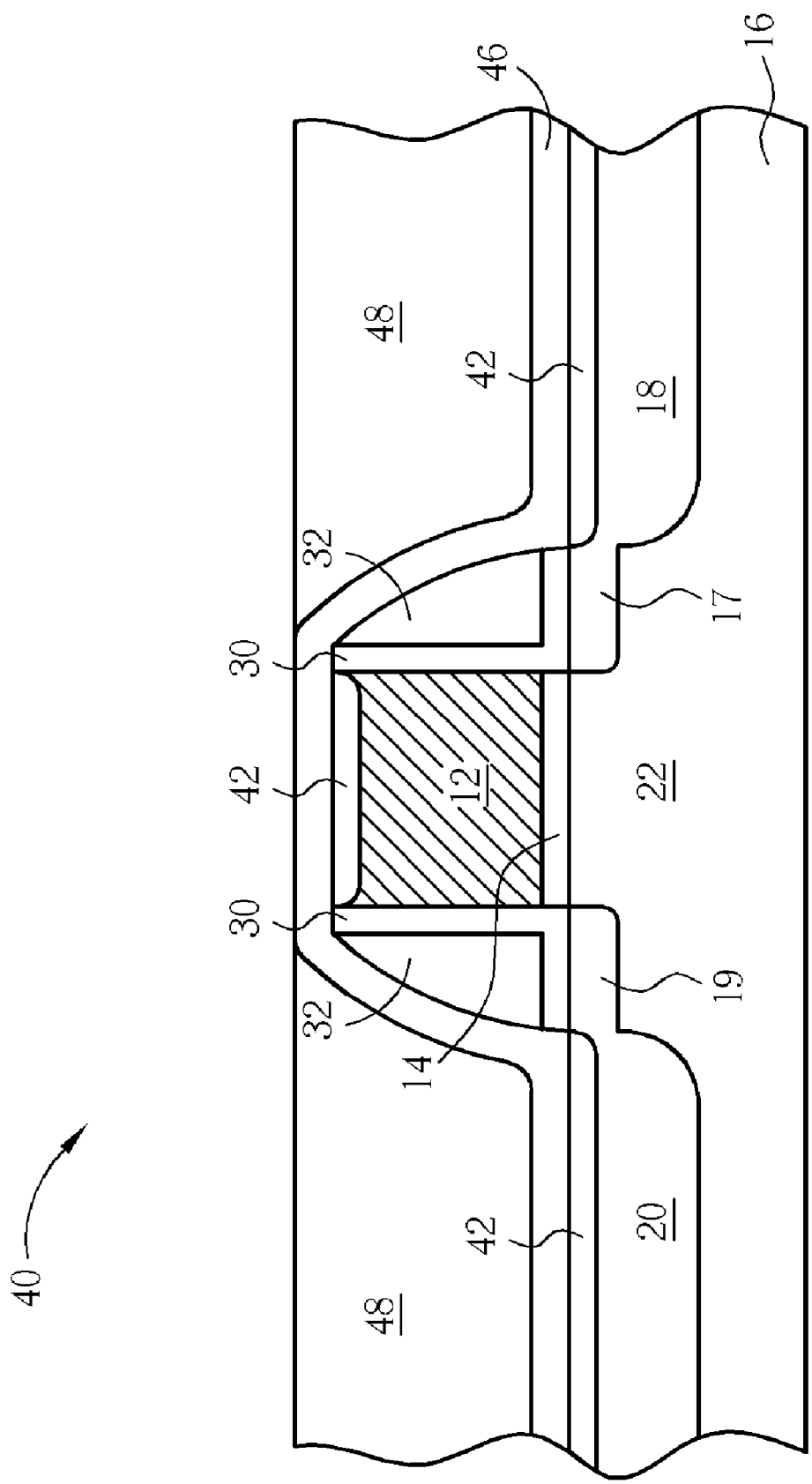
Figure 13:
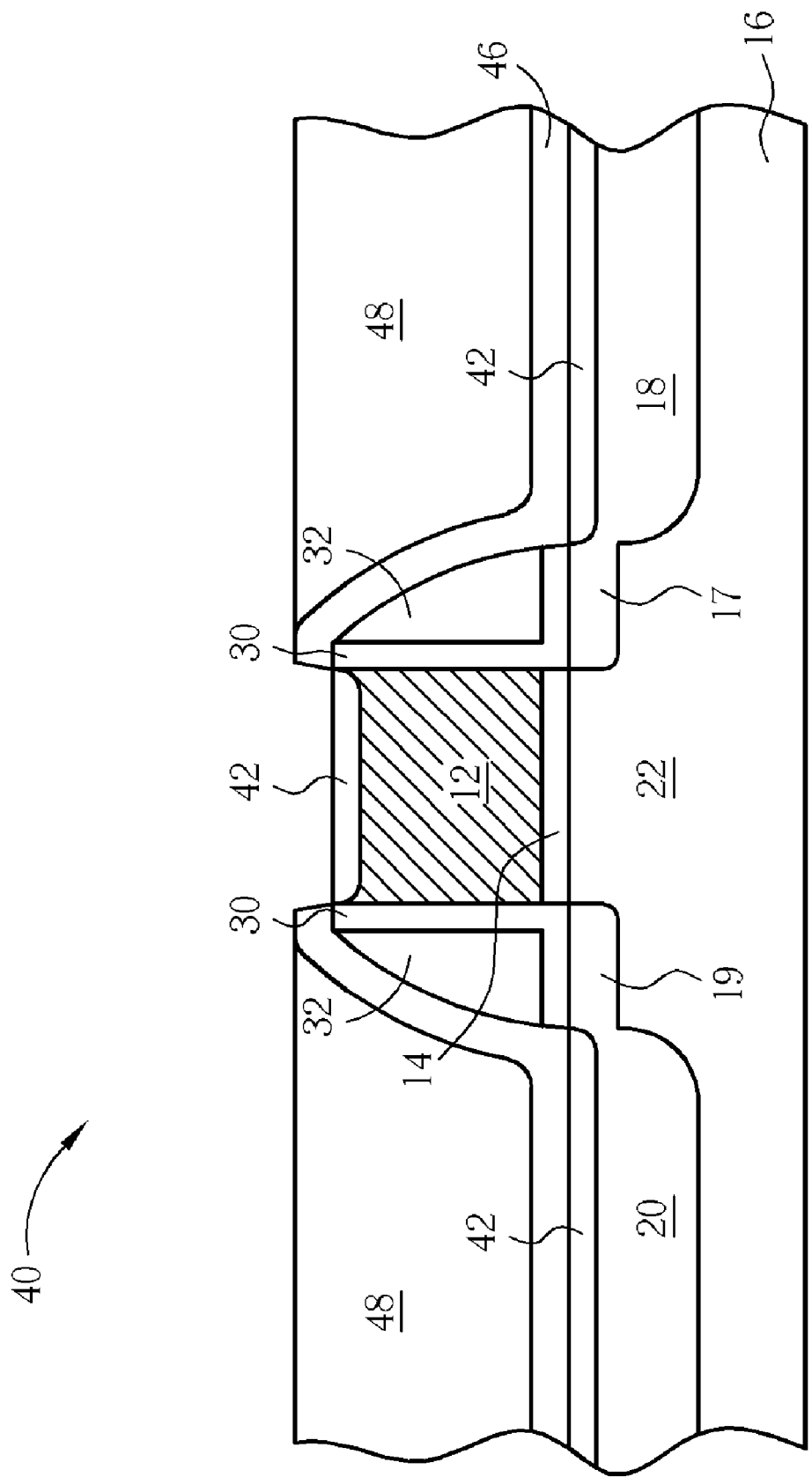

FIG. 12 shows a resulting structure after a portion of the dielectric layer 48 shown in FIG. 11 is removed through the CMP process. The silicon nitride cap layer 46 may be used as a polishing stop layer, and then be removed by an etching. A hot phosphoric acid solution may be used as an etchant to etch away the exposed silicon nitride cap layer 46. Alternatively, the silicon nitride cap layer 46 may be removed directly by CMP. FIG. 13 shows a resulting structure with an exposed metal silicide layer 42 on the gate after the silicon nitride cap layer 46 is removed.

Subsequently, the metal silicide layer 42 on the gate electrode 12 is removed by etching. A wet etching may be performed using an etching solution comprising HF, $NH_4F$, and at least one selected from a group consisting of ethylene glycol and propylene glycol in water. In the etching solution, the weight ratio for HF:$NH_4F$: the at least one selected from a group consisting of ethylene glycol and propylene glycol is preferably 0.5 to 6:15 to 25:30 to 40. In one embodiment according to the present invention, the etching solution includes about 3.5 weight % of HF, about 20 weight % of $NH_4F$, about 35 weight % of ethylene glycol or propylene glycol, and the balanced water. The etching solution has an etching rate of 60.5 and 50.4 Å/min respectively for NiSi and $CoSi_2$, and 4.77, 6.01, and 1.4 Å/min respectively for $SiO_2$, polysilicon, and SiN, at 25° C. Therefore, the etching solution has a high selective ratio to effectively remove NiSi and $CoSi_2$ layers and the $SiO_2$, polysilicon, and SiN structures remain. In the prior art, it is difficult to remove a NiSi or $CoSi_2$ layer by a CMP process.

The metal silicide layer 42 on the gate electrode 12 may be also removed by a dry etching process. An etching gas may be used to perform the dry etching process on the metal silicide layer 42 on the gate electrode 12. The etching recipe includes Ar, any one of $H_2$ and $Cl_2$, and CO. In the dry etching process, it is presumed that CO reacts with the metal of the metal silicide to produce a volatile by-product having carbonyl groups, such as, $Ni(CO)_4$. $H_2$ removes carbide film produced from chemical sputtering processes or formed from diluents for precursors of deposition. Ar ion bombardment may improve removal of products from etching. In the etching recipe, a flow rate ratio for argon:chlorine gas: carbon monoxide is preferably 5 to 15:15 to 25:5 to 15, or a flow rate ratio for argon: hydrogen gas:carbon monoxide is preferably 10 to 20:20 to 30:5 to 15.

In another embodiment according to the present invention, an etching recipe of CO, $Cl_2$, and Ar is used. The flow rates of CO, $Cl_2$, and Ar are respectively 100 sccm, 200 sccm, and 100 sccm. An etching tool, Model TCP9400, is used to perform the dry etching under a pressure of 10 mTorr at a temperature of 75° C. with a top power (TP) of 500 watts and a bottom power (BP) of 50 watts. In still another embodiment according to the present invention, an etching recipe of CO, $H_2$, and Ar is used. The flow rates of CO, $H_2$, and Ar are respectively 100 sccm, 250 sccm, and 150 sccm. An etching tool, Model DRM85, is used to perform the dry etching under a pressure of 30 mTorr at a temperature of 60° C. with a power of 1000 watts. The metal silicide layer 42 can be effectively removed in both embodiments.

Figure 14:
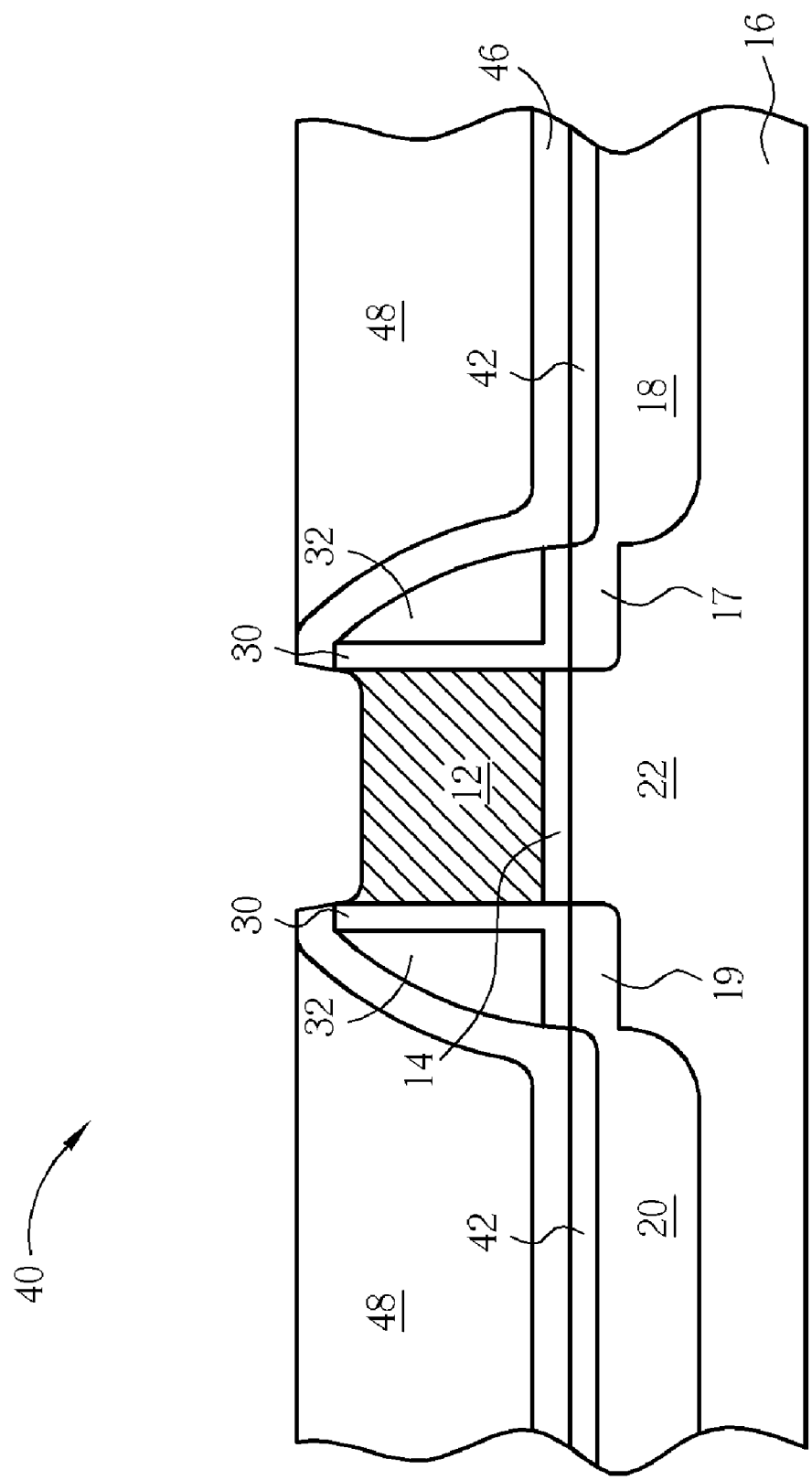
Figure 15:
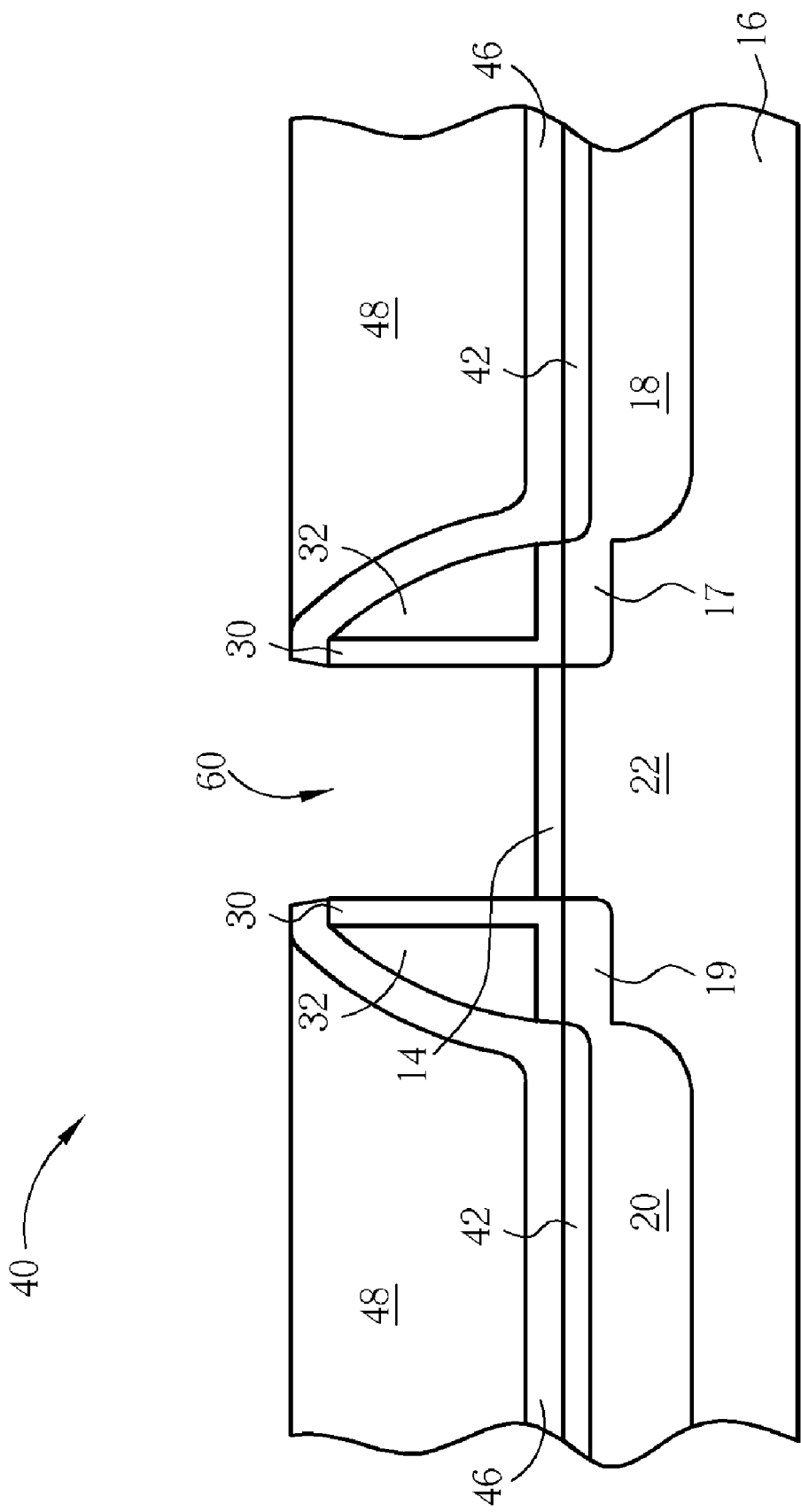
Figure 16:
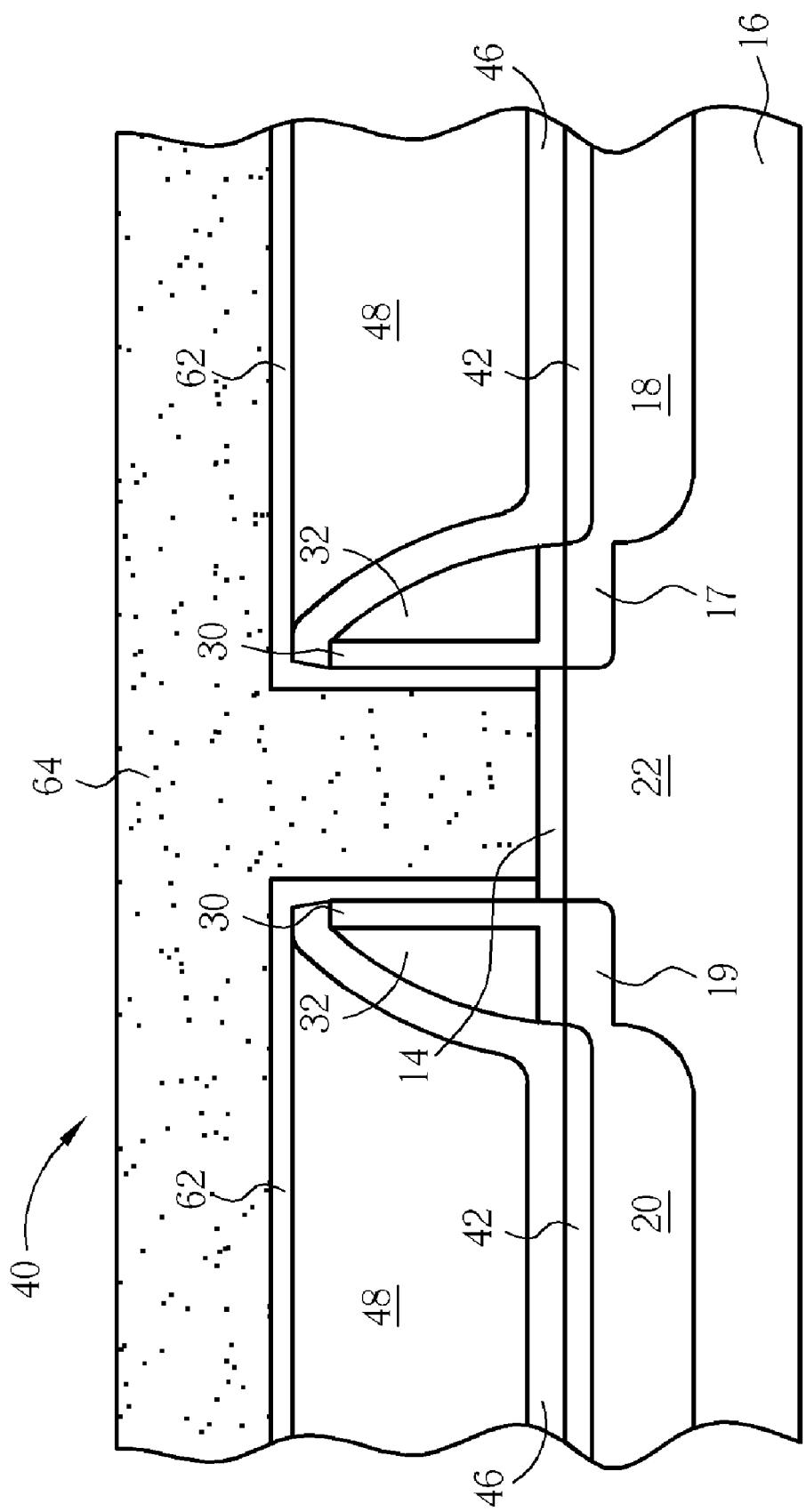
Figure 17:
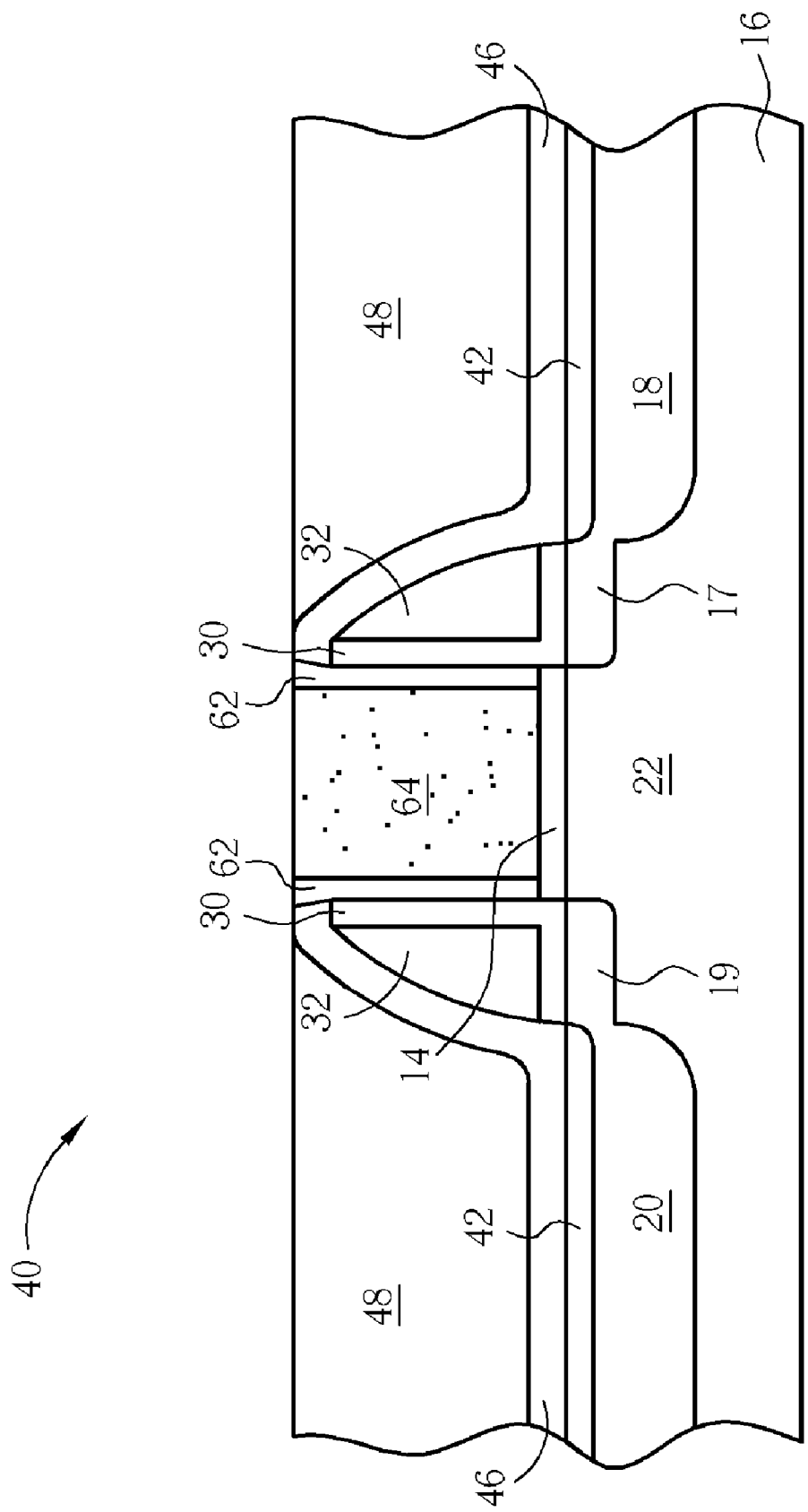

The metal silicide layer 42 mentioned above may be a metal silicide layer formed by a salicide process to a silicon layer or a polysilicon layer. After the metal silicide layer 42 is removed, a resulting structure is as shown in FIG. 14. Subsequently, an opening 60 can be formed as shown in FIG. 15 using a conventional plasma reactive ion etching (RIE) or a polysilicon wet etching. A barrier metal layer 62 may be formed on the sidewalls of the opening 60 and the surface of the dielectric layer 48, and a metal layer 64 is subsequently deposited to fill the opening 60, as shown in FIG. 16. Finally, the portion of the metal layer 64 on the dielectric layer 48 is removed, obtaining a MOS transistor 40 having a metal gate, as shown in FIG. 17.

Figure 18:
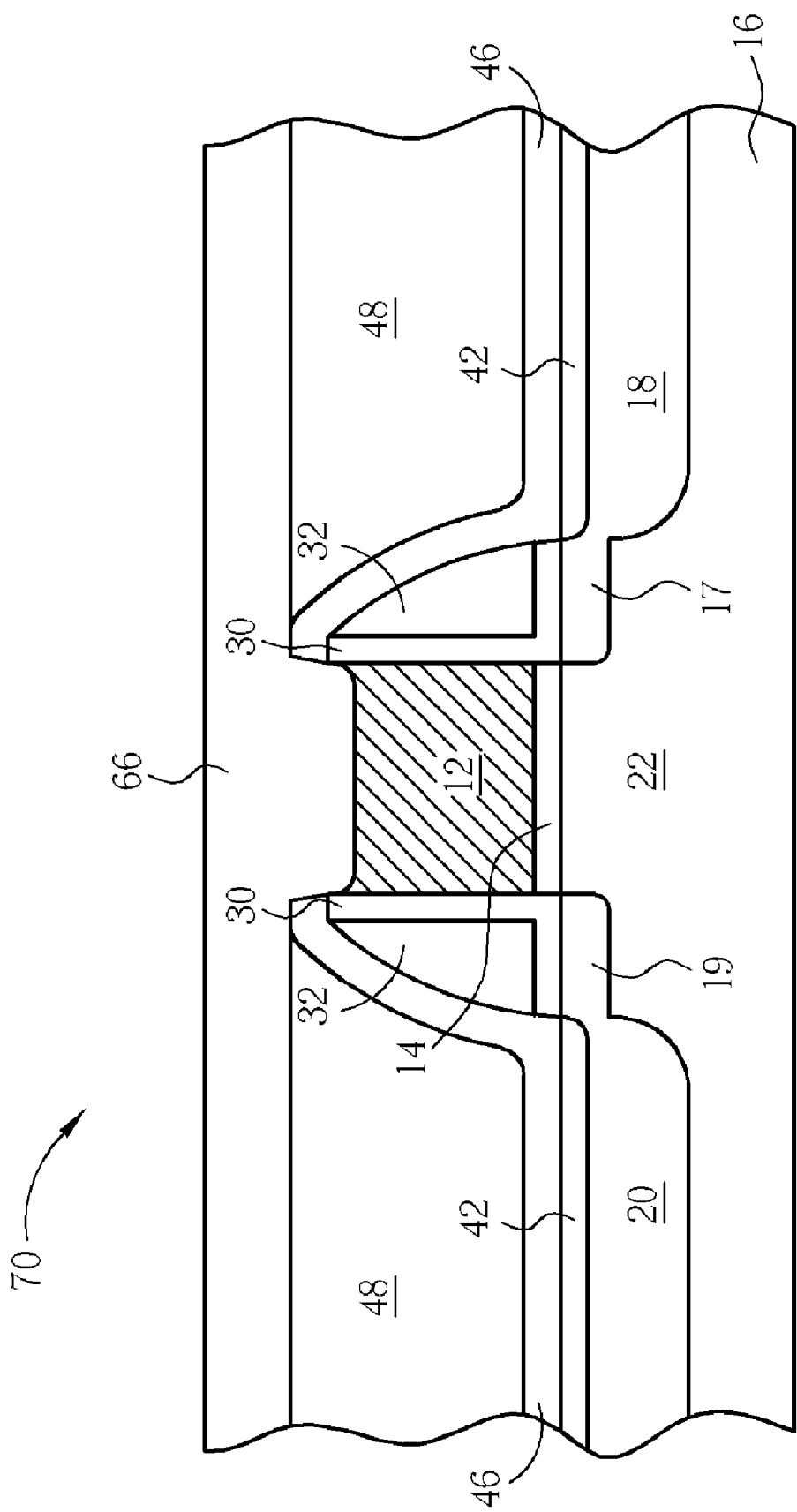
FIGS. 18 to 19 are schematic cross-sectional diagrams illustrating a method of fabricating a semiconductor MOS transistor device having a FUSI gate in accordance with one preferred embodiment of the present invention.
Figure 19:
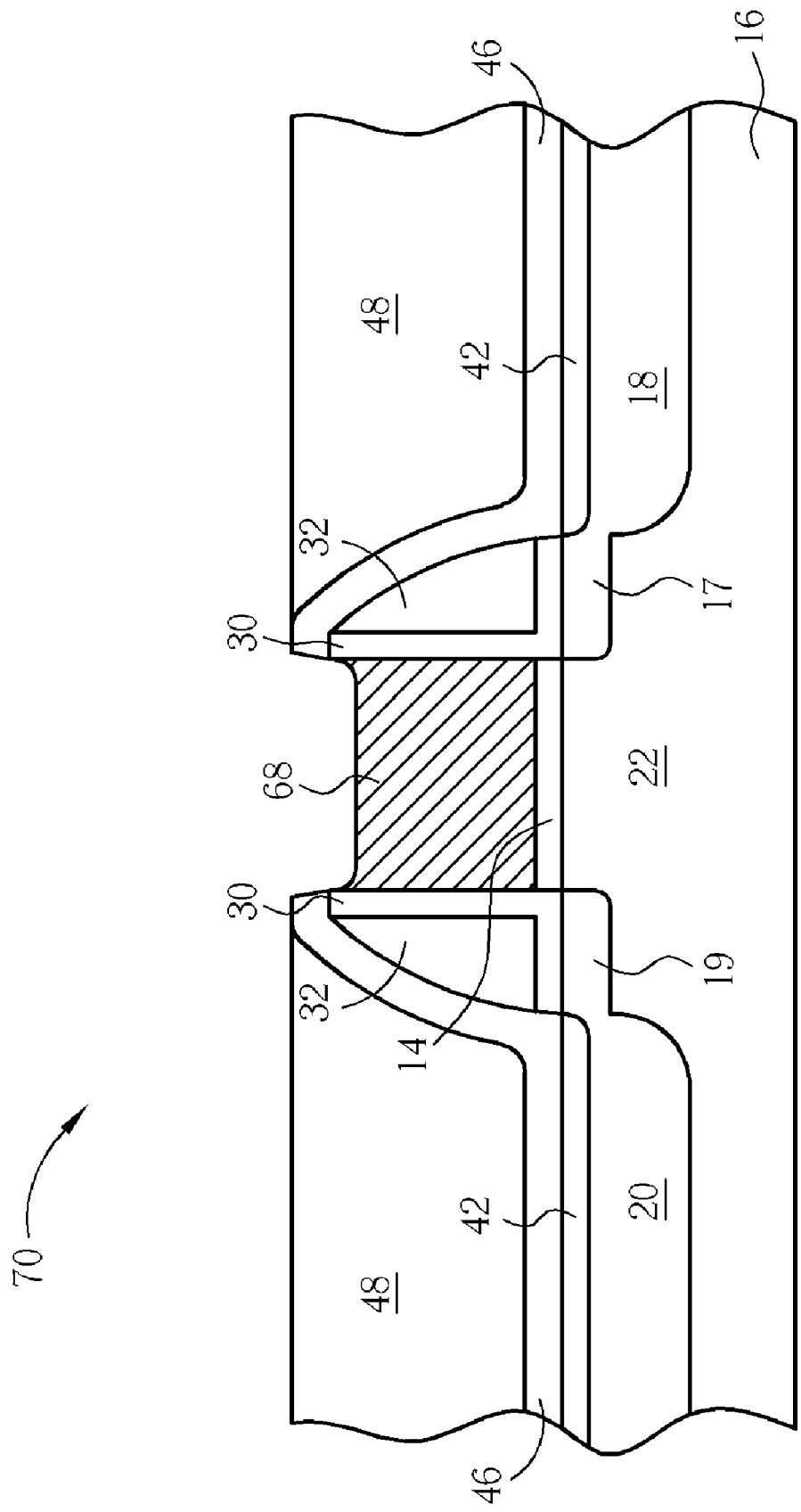

In case that a FUSI gate is desired to be manufactured, a structure as shown in FIG. 14 may be referred to. In this structure, the metal silicide layer 42 has been removed using the etching method of the present invention and the polysilicon gate electrode 12 is exposed. Next, please further refer to FIG. 18, a metal layer 66, with a thickness of about 500 to about 1000 Å or less than 1000 Å as a conventional thickness, may be deposited on the polysilicon gate electrode 12 and the silicon nitride cap layer 46. The metal layer 66 may comprise Ni, Co, Ti, Ti/TiN, Co/TiN, Co/Ti/TiN, or the like, or a multilayer thereof, for example. The resulting substrate is subjected to a thermal treatment to allow reaction of the polysilicon with the metal, forming a metal silicide. The unreacted metal is removed, and a MOS transistor 70 having a full metal polycide gate is obtained, as shown in FIG. 19.

As compared with the conventional metal gate process or FUSI gate process using a CMP process to remove metal silicide layers on original gates, the method according to the present invention, in which a means of etching to remove the metal silicide layer on the polysilicon gate electrode is used, has a superior etching selectivity and thus has an excellent removing result, such that the metal gate process or FUSI gate process can be proceeded satisfactorily.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of removing a metal silicide layer on a gate electrode in a semiconductor manufacturing process, the gate electrode being disposed on a semiconductor substrate, the gate electrode having a top surface coated with a metal silicide layer, a spacer being disposed on each side wall formed by the gate electrode and the metal silicide layer together, a silicon nitride cap layer covering the metal silicide layer, the spacers, and the semiconductor substrate, a dielectric layer covering the silicon nitride cap layer, the method of removing a metal silicide layer on a gate electrode in a semiconductor manufacturing process comprising:

performing a chemical mechanical polishing process to polish the dielectric layer using the silicon nitride cap layer as a polishing stop layer to expose the silicon nitride cap layer over the gate electrode;

removing the exposed silicon nitride cap layer to expose the metal silicide layer; and performing a first etching process to remove the metal silicide layer on the gate electrode.

2. The method of claim 1, wherein the first etching process comprises:

performing a wet etching process on the metal silicide layer on the gate using an etching solution, wherein the etching solution comprises HF, $NH_4F$, water, and at least one selected from the group consisting of ethylene glycol and propylene glycol.

3. The method of claim 2, wherein in the etching solution, a weight ratio for HF: $NH_4F$: the at least one selected from the group consisting of ethylene glycol and propylene glycol is 0.5 to 6:15 to 25:30 to 40.

4. The method of claim 3, wherein in the etching solution, a weight ratio for HF: $NH_4F$: the at least one selected from the group consisting of ethylene glycol and propylene glycol is 3.5:20:35.

5. The method of claim 1, wherein the first etching process comprises:
performing a dry etching process on the metal silicide layer on the gate using an etching recipe, wherein the etching recipe comprises argon, carbon monoxide and at least one selected from the group consisting of hydrogen gas and chlorine gas.

6. The method of claim 5, wherein in the etching recipe, a flow rate ratio for argon: hydrogen gas: carbon monoxide is 10 to 20:20 to 30:5 to 15.

7. The method of claim 6, wherein in the etching recipe, a flow rate ratio for argon: hydrogen gas: carbon monoxide is 15:25:10.

8. The method of claim 5, wherein in the etching recipe, a flow rate ratio for argon: chlorine gas: carbon monoxide is 5 to 15:15 to 25:5 to 15.

9. The method of claim 8, wherein in the etching recipe, a flow rate ratio for argon: chlorine gas: carbon monoxide is 10:20:10.

10. The method of claim 1, wherein the metal silicide layer comprises at least one selected from the group consisting of nickel silicide and cobalt silicide.

11. The method of claim 1, wherein removing the exposed silicon nitride cap layer comprises:
performing a wet etching process on the exposed silicon nitride cap layer using a hot phosphoric acid solution.

12. The method of claim 1, wherein removing the exposed silicon nitride cap layer comprises:
performing a CMP process to polish away the exposed silicon nitride cap layer.

13. The method of claim 1, wherein the dielectric layer comprises silicon oxide, $ZrO_2$, $HfO_2$, $InO_2$, $LaO_2$, or $TaO_2$.

14. The method of claim 1, wherein a gate dielectric layer is further disposed between the gate electrode and the semiconductor substrate.

* * * * *